(12) United States Patent
O'Connor et al.

(10) Patent No.: US 6,476,506 B1
(45) Date of Patent: Nov. 5, 2002

(54) PACKAGED SEMICONDUCTOR WITH MULTIPLE ROWS OF BOND PADS AND METHOD THEREFOR

(75) Inventors: Shawn M. O'Connor; Mark Allen Gerber, both of Austin; Jean Desiree Miller, Bastrop, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/966,584

(22) Filed: Sep. 28, 2001

(51) Int. Cl.7 .......................... H01L 23/48; H01L 29/44; H01L 29/52; H01L 23/34; H01L 23/50
(52) U.S. Cl. .................. 257/786; 257/784; 257/777; 257/685; 257/686; 257/775; 257/776; 257/576; 257/738; 257/737; 257/773; 257/723
(58) Field of Search .................. 257/786, 784, 257/775, 773, 776, 723, 676, 774, 737, 734, 738, 686, 685, 777

(56) References Cited

U.S. PATENT DOCUMENTS

| | | | | |
|---|---|---|---|---|
| 5,359,227 A | * | 10/1994 | Liang et al. ................. | 257/786 |
| 5,468,999 A | | 11/1995 | Lin et al. | |
| 5,691,568 A | | 11/1997 | Chou et al. | |
| 5,796,171 A | | 8/1998 | Koc et al. | |
| 5,801,450 A | | 9/1998 | Barrow | |
| 5,962,926 A | | 10/1999 | Torres et al. | |
| 6,121,690 A | * | 9/2000 | Yamada et al. ............. | 257/786 |
| 6,148,505 A | * | 11/2000 | Fujishima .................... | 29/740 |
| 6,160,313 A | * | 12/2000 | Takashima et al. .......... | 257/737 |
| 6,169,331 B1 | * | 1/2001 | Manning et al. ............. | 257/786 |
| 6,215,182 B1 | * | 4/2001 | Ozawa et al. ................ | 257/723 |
| 6,291,898 B1 | * | 9/2001 | Yeh et al. ..................... | 257/786 |
| 6,297,078 B1 | * | 10/2001 | Barrow ......................... | 257/784 |
| 6,307,271 B1 | * | 10/2001 | Nakamura .................... | 257/786 |
| 2001/0017411 A1 | * | 8/2001 | Terui ............................ | 257/784 |
| 2002/0011654 A1 | * | 1/2002 | Kimura ........................ | 257/777 |
| 2002/0024146 A1 | * | 2/2002 | Furusawa .................... | 257/777 |

FOREIGN PATENT DOCUMENTS

| | | | | |
|---|---|---|---|---|
| JP | 62-150733 | * | 7/1987 | .................. 257/786 |
| JP | 2-56942 | * | 2/1990 | .................. 257/784 |

* cited by examiner

*Primary Examiner*—Alexander O. Williams
(74) *Attorney, Agent, or Firm*—James L. Clingan, Jr.; Robert L. King

(57) ABSTRACT

A semiconductor die has three rows or more of bond pads with minimum pitch. The die is mounted on a package substrate having three rows or more of bond fingers and/or conductive rings. The bond pads on the outermost part of the die (nearest the perimeter of the die) are connected by a relatively lower height wire achieved by reverse stitching to the innermost ring(s) or row (farthest from the perimeter of the package substrate) of bond fingers. The innermost row of bond pads is connected by a relatively higher height wire achieved by ball bond to wedge bond to the outermost row of the bond fingers. The intermediate row of bond pads is connected by relatively intermediate height wire by ball bond to wedge bond to the intermediate row of bond fingers. The varying height wire allows for tightly packed bond pads. The structure is adaptable for stacked die.

9 Claims, 3 Drawing Sheets

US 6,476,506 B1

PACKAGED SEMICONDUCTOR WITH MULTIPLE ROWS OF BOND PADS AND METHOD THEREFOR

BACKGROUND OF THE INVENTION

1. Field of the Invention

This relates to packaged semiconductors and more particularly to packaged semiconductors with a die having multiple rows of bond pads that couple to a carrier of the die.

2. Related Art

As geometries in semiconductors continue to shrink in size due to improvements in the technology for making semiconductors, the die sizes themselves often become smaller. As these die sizes become smaller the complexity of the integrated circuit does not decrease but may even increase. Thus, the number of pins required for the integrated circuit does not necessarily change and if the functionality actually increases then the number of pins is likely to increase as well. Thus, for a given functionality, the die size is becoming smaller or in the alternative, for a given die size, the functionality, and thus the pin out number, is getting greater. In either case, there is then a difficulty in efficiently achieving all of the pin outs to a user of the integrated circuit. The packaging technology that is common for complex integrated circuits requiring many pin outs is called Ball Grid Array (BGA). There may in fact be a pad limit for a given size of integrated circuit. If the number of pads (pin outs) exceeds the limit for a given die size, the integrated circuit is considered to be pad limited.

One of the ways this is done is with wire bonding to the top surface of the package substrate with balls on the bottom surface and the integrated circuit being on the top surface and wire bonded to the top surface. Vias run from the top surface to the bottom surface and then traces run from the vias to the balls on the bottom and from bond fingers to vias on the top surface. It is desirable for the packaged substrate to be as small as possible, and it is also desirable for the integrated circuit to be as small as possible. In order to achieve the connections required between the integrated circuit and the top surface by way of the bond fingers, there must be enough space between the wires that run from the integrated circuit die to the bond fingers. One of the techniques for getting all of the connections made is to stagger the bond pads in two rows. This provides more space between the wires, however, there is still a limitation on how tightly spaced even the staggered ones can be. Further the staggering requires that the bond pads be further apart than the minimum that could be achieved based on the manufacturing capability. Thus the space required for the bond pads, due to staggering, is greater than the minimum space allowed for bond pads. Some techniques to try to improve the ability to provide the needed pin outs have included using cavity techniques on the substrate so that the bond fingers are on different levels. This substantially raises the cost of the substrate. Further, this may not provide for more than two rows even then.

Thus, there is a need for the ability to provide wires between an integrated circuit and bond fingers on a package substrate in a manner that does not mandate a bond spacing greater than the minimum pitch requires and being able to provide the full number of pins required without having to increase the die size simply for the purpose of being able to achieve the needed wire bonding.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

In general a packaged semiconductor is achieved using an integrated circuit die having three or more rows of bond pads coupled to a package substrate by wire bonding that has conductive power supply rings around the die and bond fingers that are in rows around the power supply rings. The bond pads on the integrated circuit may be unstaggered. They may be aligned with each other in rows in which the bond pads are not staggered and they may be at a minimum pitch. That is, the bond pads can be at a maximum density based on the technology that's available for the bond pads. This is achieved by using wire bonding of differing heights. The height of the wire bond is generally called loop height. By having variable loop heights, one wire connection can be in line with the other but also higher or lower than the one to which it is aligned. This is achieved on a substrate that is planar not requiring any change in height on the packaged substrate. Embodiments of the invention may be better understood with regard to the drawings.

Figure 1:
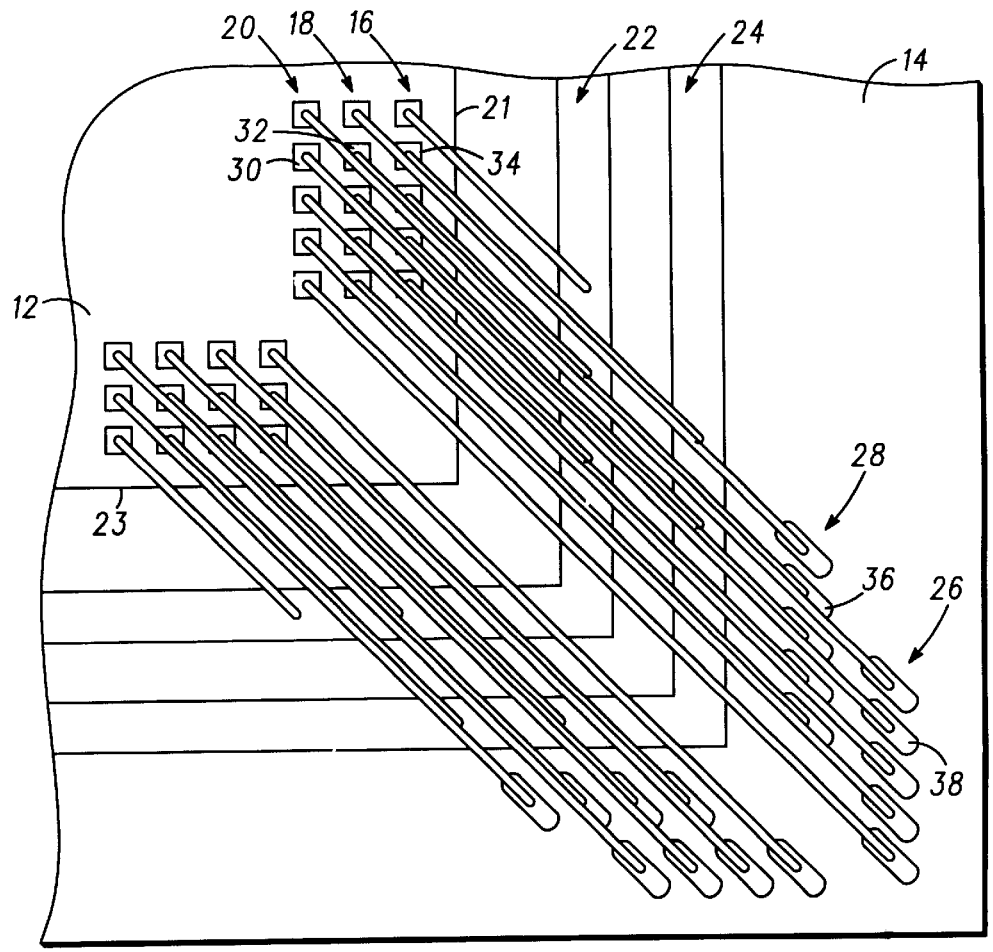
FIG. 1 is a top view of portion of a packaged semiconductor according to an embodiment of the invention.

Shown in FIG. 1 is a packaged semiconductor 10 comprising a semiconductor die (integrated circuit) 12 and a package substrate (die carrier) 14. Die 12 has on its periphery three rows of bond pads. The three rows, at differing distances from the edge, beginning with the outermost row(exterior row) are 16, 18 and 20. On substrate 14 are a conductive ring 22 and a conductive ring 24. Rings 22 and 24 completely encircle integrated circuit 12 as do rows 16, 18, and 20. Also on substrate 14 are an outermost row of bond fingers 26 and an innermost row (interior row) of bond fingers 28. Bond pad row 16 has its bonds pads ultimately coupled to rings 22 and 24. Bond pad row 18 is connected to bond finger row 28 and bond pad row 20 is connected to bond finger row 26. For example, exemplary bond pads of rows 16, 18, and 20, which are aligned to each other, are bond pads 30, 32, and 34. Similarly, an exemplary bond finger in bond finger row 28 is bond finger 36 and, and an exemplary bond finger is bond finger row 26 is bond finger 38. In this example bond finger 36 is connected by wire bond by wire to bond pad 32. Bond pad 30 is connected by wire to bond finger 38. Bond pad 34 is connected to ring 24. Rings 22 and 24 are used for power supply connections such as a positive power supply and ground. Only a portion of the actual completed package 10 and die 12 are shown. There would be many more bond pads and bond fingers. The bond fingers are shown in what is called a radial alignment in that they are spread so as to round a corner instead of being in a straight alignment with the bond pads to which they are connected.

As shown in FIG. 1 rows 16, 18, and 20 are along an edge (side) 21 and an edge 23. For one portion of rows 16–20, they are parallel with edge 21 and another portion with edge 23. With regard to edge 21 a portion of row 16 is thus along a first axis parallel to edge 21, a portion of row 18 is along a second axis parallel to edge 21, and a portion of row 20 is along a third axis parallel to edge 21. Sets of three bond pads from each row are aligned with each along an axis that is perpendicular to edge 21. For example 30–34 are aligned perpendicular to edge 21. There may be situations where it may advantageous for rows of bond pads such as rows 16–18 to extend along axes parallel to one or more edges of the die, but not all the way around the die.

As shown in FIG. 1 the wire connections to bond fingers 36 and 38 and the wire connection to ring 24 from bond pads 30, 32, and 34 are very close together as viewed from a top view. They may even be in the same line. They are, however, separated by different vertical distances from integrated circuit 12 and from packaged substrate 14. In this particular configuration the bond pads are in three rows and the bond fingers are in two rows but with an additional two rings. Thus, there is a connection depth of effectively four rows. In an alternative situation the power supply connections may not be in complete rings and the locations where rings 22 and 24 are in FIG. 1 may be occupied by rows of bond fingers. These bond fingers could be power supply connections or could be signal connections. This demonstrates the manner in which there may be three rows of bond pads on the integrated circuit connected to three or more rows of bond fingers on the package substrate.

Figure 2:
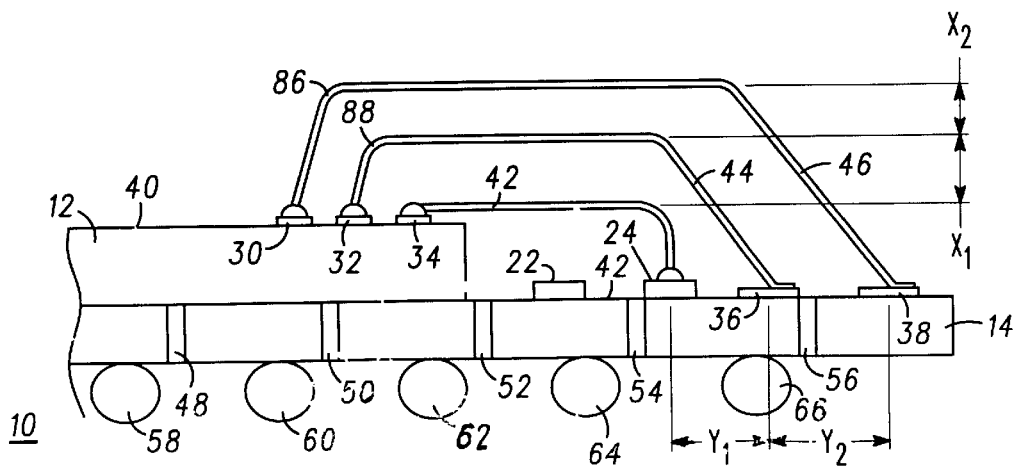
FIG. 2 is a side view of the packaged semiconductor of FIG. 1.

Shown in FIG. 2 is a side view of packaged semiconductor 10 shown in FIG. 1. This shows die 12 having a top surface 40 with bond pads 30, 32, and 34 on top surface 40. Bond pads 30, 32 and 34 are on a common plane and this could be considered a common tier of the packaged semiconductor 10. Similarly, on substrate 14 are shown ring 22, ring 24, bond finger 36 and bond finger 38. Rings 22 and 24 and bond fingers 36 and 38 are on a top surface 42 of substrate 14. The top surface 42 can be considered a plane and also can be considered a tier of the packaged semiconductor 10. Thus, bond pads 30 and 34 are on one common tier and rings 22, 24 and bond fingers 36 and 38 are on another common tier.

The wire connection between bond pad 34 and ring 24 is achieved by a technique known as reverse stitch bonding. This is achieved using a standard wire bonder in which a ball is formed on bond pad 34 with a wire connected to it. The wire is then broken by lateral movement of the bonding machine with respect to bond pad 34. A subsequent action is to form a ball on ring 24 with a wire attached to it and bring that wire straight up vertically from ring 24 and then move it laterally to bond pad 34 connecting to the ball previously formed on top of bond pad 34. The result is a wire that is substantially the same height at its highest point as the ball is above bond pad 34. The wire connection between bond pad 32 and bond finger 36 is made by first forming a ball on bond pad 32 extending the wire vertically upward, then horizontally, and then down to bond finger 36. The connection to bond finger 36 is made by a technique called wedge bonding. This type of bond is commonly available on wire bonders. In this case there is a distance between ring 24 and ring 36 shown in FIG. 2 as Y1. This Y1 dimension is made sufficiently large so that there is distance between the wire 42 and wire 44. Similarly shown in FIG. 2 is wire 46 connecting wire bond 30 and bond finger 38. A ball is formed on bond pad 30 with a wire in it that is extended vertically, then bent horizontally above wire 44 and then down to bond finger 38. Bond finger 36 and bond finger 38 are spaced by an amount Y2 shown in FIG. 2 that is sufficient to ensure adequate distance between wire 44 and wire 46.

Shown in FIG. 2 in package substrate 14 are vias 48, 50, 52, 54 and 56. Also shown in FIG. 2 attached to a bottom surface of package substrate 14 are balls 58, 60, 62, 64 and 66. Balls 58–66 are representative of an array of balls so that this package type is typically known as a ball grid array (BGA). This technique could be applicable to any wire bonding situation however. The package substrate could be any semiconductor carrier that receives wire bonds. The bond pad 30 is present in row 20 as shown in FIG. 1. The row 20 is an interior row and is spaced from an outer perimeter of die 12 greater than the spacing of row 18 which would be a middle row. Row 16 is an exterior row and is closest to the perimeter of integrated circuit 12.

The separation distance between wires should be at least equal to the diameter of the wire. Thus, wire 42 should be separated by wire 44 at its closest point by an amount equal to or greater than the diameter of wires 42 and 44. In current technology, a typical wire diameter is 25.4 microns. In standard wire bonding equipment the loop height is greater based upon the distance between the bond pad and the bond finger.

Figure 3:
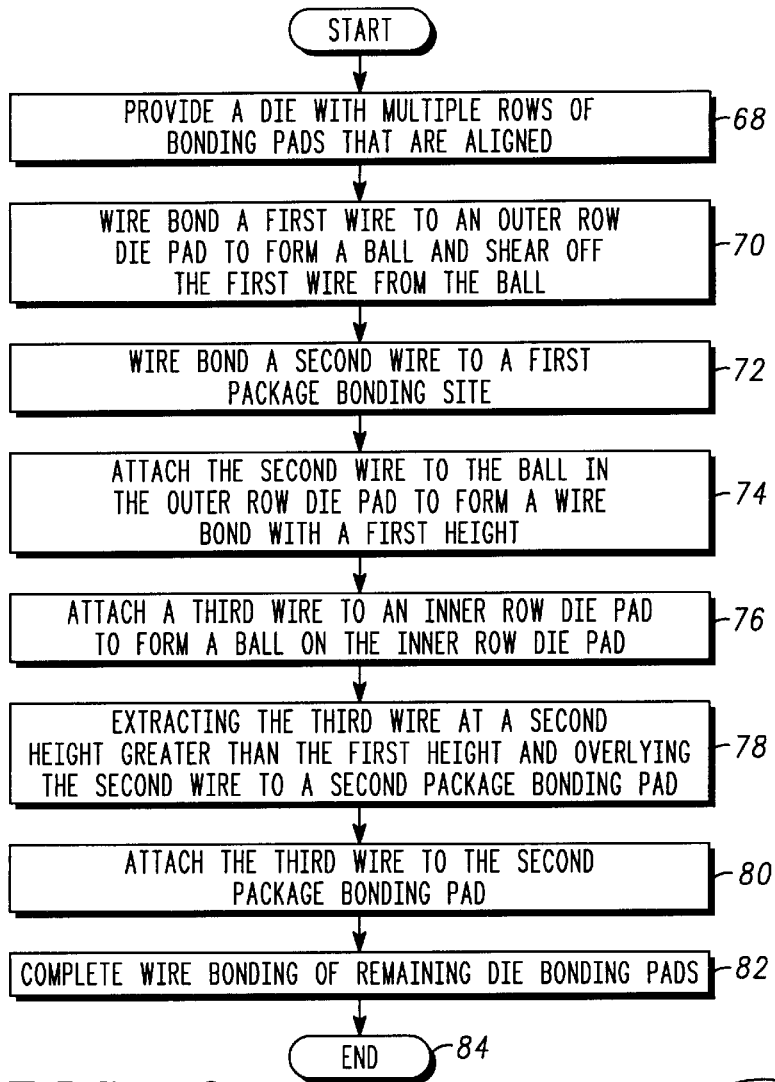
FIG. 3 is a flow diagram of a method useful in making the packaged semiconductor of FIGS. 1 and 2.

Shown in FIG. 3 is a flow diagram of a method useful in forming the packaged semiconductor 10 of FIGS. 1 and 2. The flow diagram of FIG. 3 comprises method steps in sequential order of 68, 70, 72, 74, 76, 78, 80, 82 and 84. This shows that a die is provided with multiple rows such as rows 30–34. A wire bond is formed to the bond pads on the outer row, which in the case of FIG. 1, is row 16 with a representative bond pad 34. This wire is sheared off and a ball is formed to bond finger or ring as shown in FIG. 2 as ring 24 and connected back to the bond pad on the outer row. Thus, wire 42 is an example of the second wire in box 74 of FIG. 3. A wire such as wire 44 is then formed from the middle row, in this case, row 18 and connected to a bond finger. In this case the inner row described in 76 is a row that is inner with respect to the exterior most row. In this case the exterior most row is 16. Inner rows with respect to row 16 are both rows 18 and 20. This wire 44, which is higher than wire 42, is formed after wire 42. It is a more reliable process to form the lower wires before forming the higher wires. The lower wire is preferably connected to the outer row of bond pads.

FIG. 3 shows that the wire bonding may be complete after completing two wire connections between bond pads and the package bond sites. Further processing would add another wire connection, such as wire 46 between the die 12 and package substrate 14. As shown in FIGS. 1 and 2, there are three different heights of wires shown by wires 42, 44, and 46, each of which are representative of other wires connected between die 12 and package substrate 14. Thus, three different rows of bond pads can be formed at the minimum pitch because they do not have to be staggered with respect to each other. The fourth row can be added but this would require some staggering of the rows and may result in the rows not being the minimum pitch. This technique provides for providing the needed distance between wires while maintaining maximum bond pad density. This is achieved by varying the heights of the wires that form the connections between the die and the surface between the die and the surface of the package substrate. The difference between wires 44 and 46 is achieved in the wire bonder by setting the kink height. Wires 44 and 46 each have a kink 86 and 88. This is the substantially 90 degree turn from vertical toward the bond fingers. It is desirable to have as many wires formed having the same kink height as possible.

In this case the bond pads 16 are connected as the first major step using the reverse stitch bond technique. The second major formation of wires is established with a kink height sufficient to clear the reverse stitch bonded wires. The third major step is to provide wires such as wire 46 using a kink height greater than that used for wire 44. The kink height change ensures sufficient clearance between wires. The highest kink height should be formed last and should be formed in the inner most row of bond pads.

Figure 4:
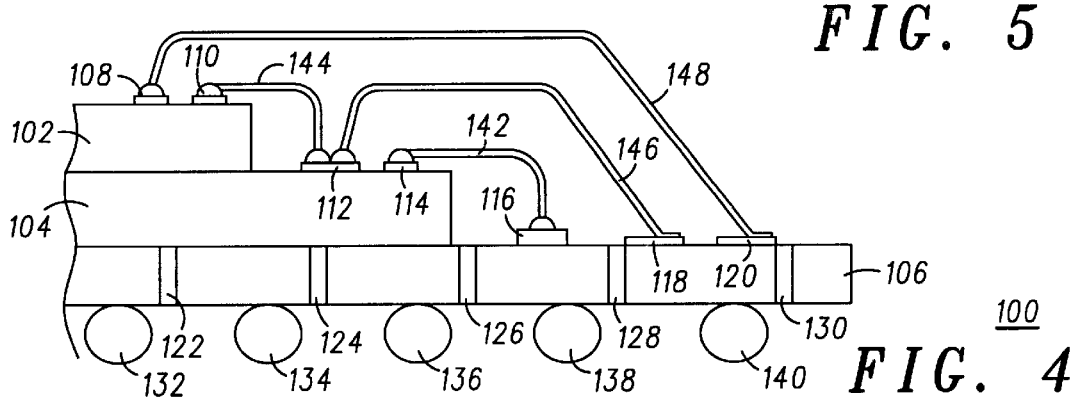
FIG. 4 is a side view of another embodiment of the invention.

Shown in FIG. 4 is a packaged semiconductor 100 comprising a semiconductor die 102, a semiconductor die 104 and a package substrate 106. Present on die 102 are bond pads 108 and 110. Present on die 104 are bond pads 112 and 114. Present on package substrate 106 are bond fingers 116, 118 and 120. Similar to the package semiconductor 10 as shown in FIG. 2 are vias 122, 124, 126, 128 and 130 through package substrate 106. On a bottom surface of package substrate 106 are conductive balls 132, 134, 136, 138 and 140. Thus completed packaged semiconductor 100 is a BGA device having stacked die.

In this case the stacked die are die 102 and die 104. Die 102 is smaller than die 104 so that bond pads 112 and 114 are exposed. Bond pad 114 is a representative bond pad of a row of bond pads surrounding die 104 on an outer perimeter. Bond pad 112 is representative 1 of a row of bond pads being entered to with respect to bond pad 114 and the outer row. Similarly, bond pad 110 is representative 1 of a row of bond pads surrounding die 102. Bond pad 108 is a representative 1 of a row of bond pads surrounding die 102 having an inner relationship to the row of bond pads that are closest to the perimeter and called the outer bond pads. Bond finger 116 is a representative one of a row of bond fingers having an innermost location with regard to package substrate 106. Bond finger 120 is a representative 1 of a row of bond fingers as an outermost row of bond fingers. Bond finger 118 is a representative 1 of a row of bond fingers between the innermost row and the outer row. In this example the reverse stitch bond is between bond pad 114 and bond finger 116. Thus, the outer row of bond pads of die 104 are connected to the innermost row of bond fingers. Bond pad 114 is connected to bond finger 116 by wire 142. Similarly, the innermost row (interior row) of die 104 is connected to the outermost row (exterior row) of die 102.

As shown in FIG. 4, bond pad 110 is connected to bond pad 112 by wire 144. Bond pad 112 is made sufficiently large so the two balls can be formed on it. Thus, bond pad 112 is connected to bond finger 118 by using ball bond to wedge type of wire bond. Thus, bond pad 112 has a wire 146 connected to it by wire bonding and wire 146 is wedge bonded to bond finger 118. Bond pad 108 is connected to bond finger 120 by a wire 148. This wire 148 is also connected by ball bond on one end and wedge bond on the other. The ball bond is to bond pad 108 and the wedge bond is to bond finger 120. In this arrangement the die 102 is electrically coupled to die 104 by a reverse stitch bond in the same manner that bond finger 116 is connected to bond pad 114. Thus, these two types of connections can be made as part of the same processing procedure. Also similarly, wires 146 and 148 can be formed as part of the same set up for the wire bonder. The kink height for 146 and 148 can be the same and there still be sufficient clearance between them.

Figure 5:
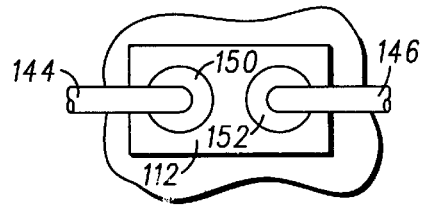
FIG. 5 is a top view of a portion of the packaged semiconductor of FIG. 4.

In this example die 102 then is conveniently connected to die 104 by reverse stitch bonding and to package substrate 106 by a regular ball bond to wedge bond connection. Thus this arrangement shown in FIG. 5 provides for die 102 having the flexibility of connections to both die 104 and package substrate 106. Similarly, die 104 is connected to package substrate 106 and to die 102, also for maximum flexibility. Due to the different tiers of die 102 and die 104 and in light of the reverse stitch capability of wire bonders, three different heights are achieved in connecting to package substrate 106 and the connection between die 102 and die 104 is easily lower than the connection from die 102 to package substrate 106. Thus, a stacked die arrangement is achieved with high density capability. If there needs to be a third row of bond pads on die 104 for example, this can be achieved by putting a row of bond pads between bond pads 112 and 114. Bond pads 112 and 114 would be spaced further apart but could still be the minimum spacing with the new row present. The new row would provide a kink height that is sufficiently high to clear wire 142 and sufficiently low to be under wire 146. This might require raising the kink heights of wires 146 and 148. There would also be another row of bond fingers between bond finger 118 and bond finger 116. This may require increasing the kink outs of wires 146 and 148.

Shown in FIG. 5 is bond pad 112 showing separate ball bonds 150 and 152 and showing wire 144 connected to ball bond 150 and wire 146 connected to ball bond 152. The typical technique for having a wire brought to a pad, wedge bonded at the pad, and then extended to another location with the continuous wire. This has the problem of differing profile parameters for each side of the wedge bond. One side of the wedge bond will have a profile that is different from the profile on the other side of the wedge bond. This can make it difficult to clear the edge of the die in the case of the connection such as between bond pad 110 and bond pad 112. The bond pad 112 being enlarged and having two ball bonds provides for a sharp angle between bond pad 110 and bond pad 112 that provides for clearance of wire 144 from the corner of die 102. Thus there is seen the benefit of being able to have high density rows of bond pads and the flexibility of being able to conveniently provide stack die arrangements.

Figure 6:
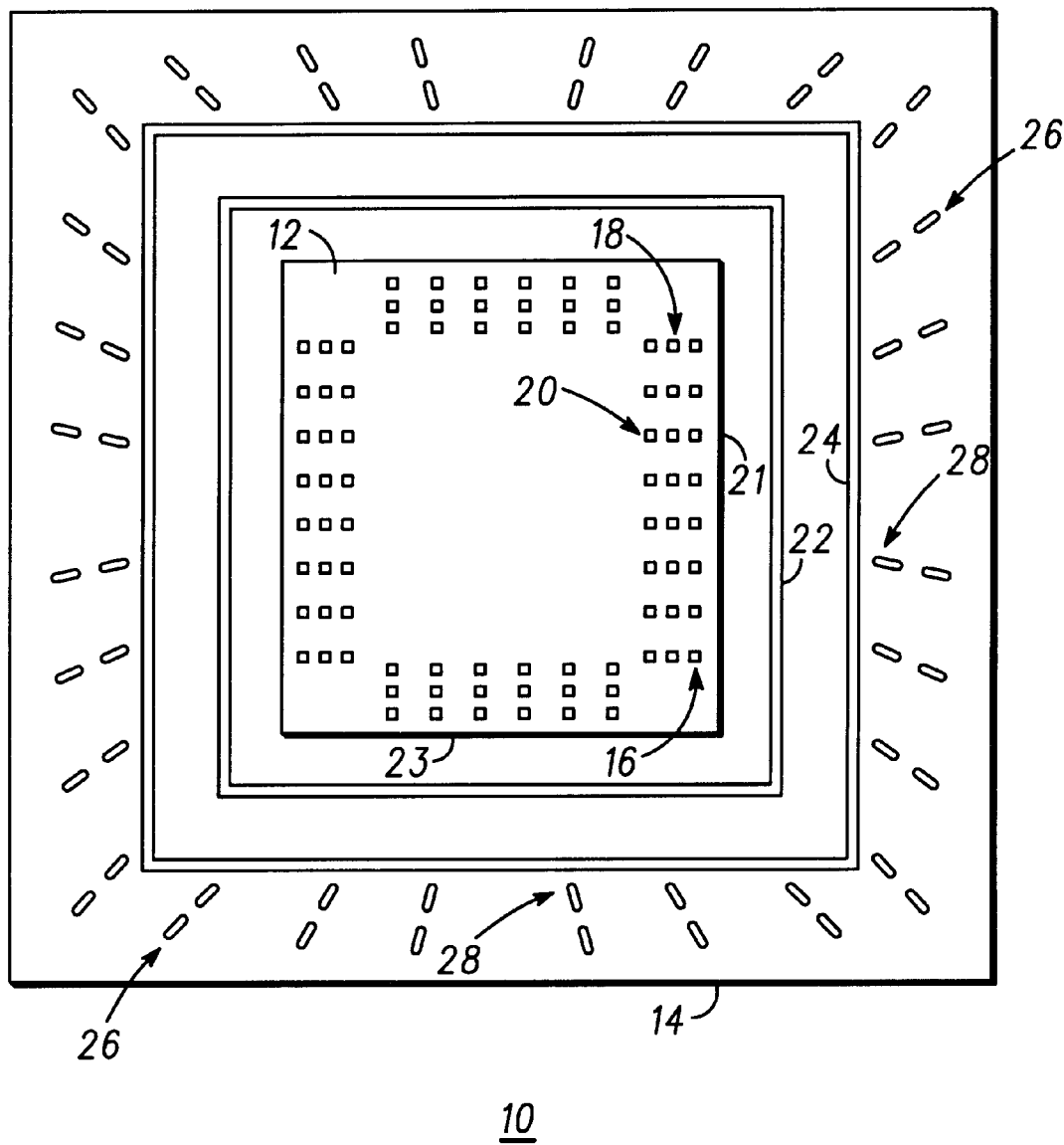
FIG. 6 is a top view of the whole packaged semiconductor of FIG. 1 in more simplified form.

Shown in FIG. 6 is the whole packaged IC 10, in simplified form and without the wire bonds. This shows rows of conductors 22 and 24 surrounding the integrated circuit 12. This also shows rows of bond pads 16, 18, and 20 and rows of bond fingers 26 and 28. FIG. 6 also shows the bond pads in three rows adjacent to the perimeter of the integrated circuit 12 and the bond fingers in rows adjacent to the edges of the integrated circuit 12. For simplicity and ease of understanding, the number of bond pads and bond fingers as shown in FIG. 6 is greatly reduced.

Thus, by altering the height of the loops by using varying kink heights and by using reverse stitch technique on the same package semiconductor it is possible to achieve the high density number of pin outs without having to unnecessarily increase the size of the die. The bond pads in multiple rows can be the maximum density and can be aligned with each other. This is achieved without having to make cavities in the package substrate. Thus, the bond fingers are all on the same plane, that is to say, the same tier and the bond pads are all also on the same tier of the particular integrated circuit. There is no requirement of altering the heights of the bond pads on the integrated circuit or of altering the heights with respect to each other on the package substrate. Alternative approaches to achieving the loop heights may be available as well. As equipment changes and improves, the availability of different bonding types may be available so that the ball bonds may be effective for both the bond fingers and the semiconductor die. In this particular embodiments described the wires are preferably gold, which is a desirable metal because of its high conductivity and its malleability, but other materials may be found to be satisfactory as well, such as copper. Copper is significantly cheaper material and is now being commonly used in the manufacturing of integrated circuits themselves and may have advantages in compatibility with the bond pad material used in a copper process.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor package comprising:
   a die having at least one side with multiple rows of bond pads, each row of the multiple rows of bond pads being a different distance from an edge of the die;
   a die carrier for supporting the die, the die carrier having a plurality of bond fingers, all of which are on a same tier, the plurality of bond fingers being distributed around the die with a first portion located in an inner region of the die carrier and a second portion located in an outer region of the die carrier; and
   a plurality of bond wires, each of the plurality of bond wires connecting a predetermined one of the bond pads to a predetermined one of the plurality of bond fingers, wherein:
      a first bond pad of a first of the multiple rows of bond pads has a different bond profile from a second bond pad of a second of the multiple rows of bond pads as a result of using different wire bonding processes to bond the first bond pad and the second bond pad; and
      the first bond pad has a reverse stitch bond profile and the second bond pad has a ball bond profile.

2. The semiconductor package of claim 1 wherein the first bond pad and the second bond pad are substantially aligned along an axis perpendicular to the edge of the die so that the first bond pad and the second bond pad on the die are non-staggered.

3. The semiconductor package of claim 2 wherein the multiple rows of bond pads further comprise three or more rows of in-line bond pads, each of the multiple rows of bond pads having a bond pad that aligns via an axis perpendicular with the edge of the die with a predetermined bond pad of each of all remaining rows.

4. The semiconductor package of claim 1 further comprising:
   a second die positioned above the die and having a plurality of second die bond pads, at least a first of the plurality of second die bond pads being connected to the first bond pad of the first of the multiple rows of bond pads and at least a second of the plurality of second die bond pads being connected to a predetermined one of the plurality of bond fingers of the die carrier.

5. A method of electrically connecting a semiconductor die to a die carrier, comprising:
   providing a die having multiple rows of bonding pad that are aligned;
   wire bonding a first wire to an outer row die pad to form a wire bond having a first height;
   attaching a second wire to an inner row die pad to form an electrical connection on the inner row die pad;
   extending the second wire at a second height greater than the first height and overlying the first wire to a second package bonding pad;
   attaching the second wire to the second package bonding pad; and
   completing wire bonding of remaining die bonding pads of the semiconductor die;
   wherein the wire bonding of the first wire to the outer row die pad comprises:
      forming a ball;
      shearing off the first wire from the ball;
      wire bonding a remainder portion of the first wire to a first package bonding site; and
      attaching the first wire to the ball in the outer row die pad.

6. A semiconductor package comprising:
   a first die having at least two rows of bond pads that are aligned with respect to a side of the first die;
   a second die overlying the first die, the second die having at least two rows of bond pads that are aligned with respect to a side of the second die;
   a die carrier underlying the first die and the second die for supporting the first die and the second die and providing a plurality of bond fingers;
   a first wire bond connecting a first bond pad contained within a first of the at least two rows of bond pads of the first die to a predetermined bond finger of the plurality of bond fingers; and
   a second wire bond connecting a second bond pad contained within a second of the at least two rows of bond pads of the first die to a predetermined bond pad within one of the at least two rows of bond pads of the second die.

7. The semiconductor package of claim 6 wherein the first wire bond further comprises:
   a bond pad that has multiple bonds connected thereto.

8. The semiconductor package of claim 6 wherein the first wire bond is a different type of wire bond profile than the second wire bond.

9. The semiconductor package of claim 6 further comprising conductive spheres positioned under the die carrier.

* * * * *